US009786448B2

(12) United States Patent
Mans

(10) Patent No.: US 9,786,448 B2
(45) Date of Patent: Oct. 10, 2017

(54) CONTROLLER FOR USE WITH A MECHANICAL SWITCH

(75) Inventor: Paul Mans, London (GB)

(73) Assignee: MFL Projects Limited, Hertfordshire (GB)

( * ) Notice: Subject to any disclaimer, the term of this patent is extended or adjusted under 35 U.S.C. 154(b) by 1004 days.

(21) Appl. No.: 13/989,143

(22) PCT Filed: Nov. 24, 2011

(86) PCT No.: PCT/GB2011/052311
§ 371 (c)(1),
(2), (4) Date: Sep. 10, 2013

(87) PCT Pub. No.: WO2012/069837
PCT Pub. Date: May 31, 2012

(65) Prior Publication Data
US 2013/0342029 A1 Dec. 26, 2013

(30) Foreign Application Priority Data
Nov. 24, 2010 (GB) .................................. 1019930.5

(51) Int. Cl.
H01H 3/02 (2006.01)
H01H 3/20 (2006.01)
(Continued)

(52) U.S. Cl.
CPC ............. *H01H 9/54* (2013.01); *G01R 35/005* (2013.01); *H01H 9/02* (2013.01); *H01H 23/148* (2013.01);
(Continued)

(58) Field of Classification Search
CPC ................. H01H 35/027; H01H 23/16; H01H 2300/002; H01H 9/54; H01H 23/148;
(Continued)

(56) References Cited

U.S. PATENT DOCUMENTS 3,171,920 A * 3/1965 Klein ..................... H01H 3/264
200/330
3,179,396 A * 4/1965 Bracken .................. H01H 7/02
138/43
(Continued)

FOREIGN PATENT DOCUMENTS

GB 2 443 854 A 5/2008

OTHER PUBLICATIONS

International Search Report for corresponding patent application No. PCT/GB2011/052311 mailed Mar. 5, 2012.
(Continued)

Primary Examiner — Rexford Barnie
Assistant Examiner — Thai Tran
(74) Attorney, Agent, or Firm — Renner, Otto, Boisselle & Sklar, LLP

(57) ABSTRACT

Embodiments of the present invention relate to a controller (1) for use with a mechanical switch (2). The controller (1) comprises at least one sensor (9), an actuator and at least one attachment member (5) suitable for attaching the controller (1) to the mechanical switch (2) such that the actuator is brought into contact with the mechanical switch (2). The actuator is arranged to operate the mechanical switch (2) in response to a signal from the at least one sensor (9), in use.

13 Claims, 3 Drawing Sheets

(51) Int. Cl.
  *H01H 9/54* (2006.01)
  *H01H 9/02* (2006.01)
  *H01H 23/14* (2006.01)
  *G01R 35/00* (2006.01)
  *H05B 37/02* (2006.01)

(52) U.S. Cl.
  CPC ..... *H05B 37/0227* (2013.01); *H01H 2300/03* (2013.01); *Y02B 20/44* (2013.01); *Y02B 90/224* (2013.01); *Y04S 20/14* (2013.01); *Y10T 307/766* (2015.04)

(58) Field of Classification Search
  CPC ........ H01H 3/02; H01H 3/20; H05B 37/0227; G01R 35/005
  See application file for complete search history.

(56) References Cited

U.S. PATENT DOCUMENTS

| | | | | |
|---|---|---|---|---|
| 3,985,982 | A * | 10/1976 | Schneidinger | G04F 3/027 200/33 R |
| 4,508,943 | A * | 4/1985 | Pfeiffer | H01H 21/24 200/17 R |
| 4,645,942 | A * | 2/1987 | Nilssen | H01H 43/04 307/126 |
| 4,912,376 | A * | 3/1990 | Strick | H01H 43/00 200/17 R |
| 5,397,869 | A * | 3/1995 | Huen | H01H 3/26 200/330 |
| 5,719,362 | A * | 2/1998 | Gray, Jr. | H01H 3/26 200/38 R |
| 5,806,665 | A * | 9/1998 | Houssian | H01H 23/148 200/330 |
| 5,955,796 | A * | 9/1999 | Nilssen | G04F 1/005 200/38 B |
| 2003/0015410 | A1* | 1/2003 | Whetzel | H01H 23/14 200/331 |
| 2004/0124801 | A1* | 7/2004 | Jurado | G05B 13/0265 318/476 |
| 2004/0243025 | A1* | 12/2004 | Peles | A61H 1/0277 601/5 |
| 2005/0194243 | A1* | 9/2005 | Prineppi | H01H 3/26 200/556 |
| 2007/0193862 | A1* | 8/2007 | Blakeman | G04F 3/06 200/33 R |
| 2008/0047818 | A1* | 2/2008 | Holcomb | G04G 15/006 200/52 R |
| 2008/0202909 | A1* | 8/2008 | Agronin | H01H 3/227 200/331 |
| 2012/0238808 | A1* | 9/2012 | Teichtmann | A61B 1/00025 600/109 |

OTHER PUBLICATIONS

Written Opinion for corresponding patent application No. PCT/GB2011/05231 mailed Mar. 5, 2012.

* cited by examiner

CONTROLLER FOR USE WITH A MECHANICAL SWITCH

This application is a national phase of International Application No. PCT/GB2011/052311 filed Nov. 24, 2011 and published in the English language.

FIELD OF THE INVENTION

This invention relates to a controller for use with a mechanical switch, and to a method for calibrating such a controller.

BACKGROUND TO THE INVENTION

Due to cost and concern over the environment, there is now a constant and growing demand to reduce energy consumption in all aspects of life. It is widely recognised that the failure to switch off lights and other appliances leads to the waste of a great deal of energy, and yet at first glance this area appears to be one of the easiest areas of waste to tackle. For example, occupancy detector switches which automatically control electrical lights are well known. However these devices are not as widely used as they could be and this may be in part because they are typically either installed in a ceiling or must replace existing light switches, and are always electrically connected to the circuit which supplies power to the lights. Such automatic controls are therefore difficult to install, and must be fitted by a qualified electrician if they are to function correctly and safely. The time and expense involved in such an installation is enough to put off many potential users, who instead continue to use wasteful manual controls.

Therefore automatic controllers which can be easily retro-fitted to existing installations would be very desirable, especially if those controllers required no wiring and a minimum of time and expertise to be spent on installation.

SUMMARY OF THE INVENTION

In pursuit of this aim, a presently preferred embodiment of the present invention provides a controller for use with a mechanical switch. The controller comprises at least one sensor, an actuator and at least one attachment member suitable for attaching the controller to the mechanical switch such that the actuator is brought into contact with the mechanical switch. The actuator is arranged to operate the mechanical switch in response to a signal from the at least one sensor, in use.

In this way, the invention provides a controller that can be retrofitted to the front of an installed power switch, such as a light switch, and which can automatically activate and deactivate the switch in response to predefined conditions. This controller does not require any wiring or electrical contact with the power switch.

Typically, the attachment member comprises holes which are suitable for receiving screws. The attachment member may also comprise adhesive strips. The attachment member may comprise arms or clips which extend from the controller.

Typically, at least one sensor is a person detector. In a preferred embodiment, the person detector is a Passive Infra Red (PIR) detector, as PIR detectors are low cost and have low power requirements. However, microwave detectors or another type of detector that can detect human presence or movement can also be used.

With a person detector, a controller according to the invention can be used to automatically operate a switch in response to the presence of a person. For example, a controller attached to a light switch could be used to activate the light when a person is detected. In this way, by fitting a controller according to the invention, a standard light switch is adapted into an occupancy detector switch.

Also typically, at least one sensor is a timer. Where the controller comprises a timer, it may also comprise a user-operable control which can be used to set the length of time counted by the timer.

With a timer, the controller can operate a switch a set time after an event. So, for example, if a light controlled by the controller is activated, the timer may count one minute before sending a signal to operate the switch and so turn off the light. Hence when a controller according to the invention comprises both a person detector and a timer, and is fitted to a light switch, the controller can then turn on a light in response to the presence of a person, wait one minute, and then turn off the light again. This provides any people in the room with light, but also conserves power by turning off the light when there are no people present.

Other sensors can be used. For example, the controller may comprise a receiver suitable for receiving signals from a remote control unit. This receiver may be capable of receiving signals in infra-red or radio frequency electromagnetic radiation, or any other suitable transmission medium. Thus, the controller may comprise a wireless receiver that allows the controller to be controlled remotely by another wireless device. The controller may also comprise a light sensor suitable for sensing ambient levels of visible light. This is especially useful when the controller is to be fitted to a light switch, as the controller can be configured to keep the light switch turned off if the ambient levels of visible light are above a certain threshold.

Typically, the actuator comprises an elongate arm. Where this is the case, the actuator may comprise a protrusion which extends substantially orthogonally to the longitudinal axis of the elongate arm, such that the protrusion contacts the mechanical switch, in use. Where a rocker switch is used, such a protrusion provides space between the switch and the elongate arm, so that the switch has room in which to operate. Such a protrusion also reduces the surface area of the actuator that is in contact with the switch. Where the actuator moves relative to the switch in use, a reduction in contact surface area also reduces the friction acting against the movement of the actuator, and so reduces the work done by the actuator to operate the switch.

To further reduce any friction between the switch and the actuator, the actuator may comprise a bearing.

Where the actuator comprises an elongate arm, the elongate arm will often move longitudinally to operate the mechanical switch, in use. Alternatively, the actuator may move in another direction. For example, the actuator may rotate to operate the mechanical switch, in use. Where the actuator rotates, it is typically about an axis which passes through the actuator.

The actuator may also comprise a disc. A disc may be advantageous where similarly shaped switch is to be controlled, for example a dimming light switch with a disc shaped switch which must be rotated to control the level of dimming. A disc shaped actuator can maximise the area of contact between the actuator and such a switch, and so help to prevent slipping between the actuator and switch, in use. Where the actuator comprises a disc, therefore, the actuator will often rotate about an axis which is perpendicular to the face of the disc to operate the mechanical switch, in use. The actuator will also often rotate about an axis which passes through the centre of the face of the disc to operate the mechanical switch, in use.

Where an actuator rotates, it may also move along the axis of rotation to operate the mechanical switch, in use. This is useful where a rotatable switch also comprises a push button switch, as with a dimming light switch which must be pushed to turn the light on and off, and turned to adjust the lighting level.

Where a controller is fitted to a dimming switch such as the one described above, and the controller comprises a light sensor suitable for sensing ambient levels of visible light, the controller can be used to maintain the ambient levels of visible light at or above a predetermined level.

The actuator is not limited to elongated arms and discs. Rather, the actuator may be any shape suitable for operating a switch.

Typically, the controller further comprises a battery. With a battery fitted, the controller can operate without any external electrical connections, as a self-contained unit. This makes installation and use of the controller simpler, and means that the controller can be installed by an inexperienced and unqualified user, as the user will not have to interact with live wires in any way.

Typically the controller comprises a detector suitable for detecting resistance to the movement of the actuator. Where the actuator is moved by an electrical motor, it may be that the detector measures the load on the electrical motor, in use. Alternatively, the detector may be a pressure sensor attached to the actuator.

In an embodiment of the invention, the controller comprises a resilient member attached to the actuator such that moving the actuator to operate the switch places a load on the resilient member. The stored potential energy in the resilient member can then provide assistance in further moving the actuator. In this way a controller according to the invention can store energy for later use as a switch is operated.

Where a resilient member is used, the controller may also comprise a latch for retaining the resilient member in a loaded position. When the actuator is subsequently required to move in the direction of relaxation of the elastic member, the latch can be released so that the actuator will travel back. Typically, this will result in the switch being operated again. The latch may comprise a solenoid or other suitable mechanical means. Alternatively, in place of a latch, the force exerted by the resilient member may be resisted by a motor such as the electrical motor described above, or by a mechanical gear system, or by a frictional brake, or by any other suitable means.

In some embodiments, no latch or other delay mechanism will be necessary; where the controller is intended to work with a push button with a latching action, it may be desirable to have the actuator return to a resting state immediately the switch has been operated, so that the actuator can subsequently be moved to operate the switch again.

When the resilient member is released, it may move the actuator by itself, or it may be assisted by a motor. Embodiments whereby the resilient member can pull or push the actuator by itself are advantageous, since in such embodiment a motor put in place to move the actuator need only operate in one direction, However, embodiments in which both the resilient member and a motor are used may be desirable, for example because the motor will continue to function if the resilient member fails.

The resilient member may be a leaf spring, or a compression spring, or any other suitable device.

The invention also extends to a method for calibrating a controller as described above, where the controller comprises a detector suitable for detecting resistance to the movement of the actuator. The method comprises: moving the actuator; detecting changes in resistance to the movement of the actuator; and setting limits for the subsequent movement of the actuator based upon the detected resistances.

In this way, a controller according the invention can automatically calibrate itself, adjusting to the size and position of a switch without the need for manual calibration. So for example, controllers which work with rocker switches such as the one shown in FIG. 1 and FIG. 2 can determine when a switch has been "switched" by detecting a decrease in resistance. In contrast, controllers which work with push-button switches can determine when the switch has been pushed by detecting an increase in resistance. These and many other types of controller according to the invention can determine when the actuator reaches the switch by detecting an increase in resistance.

It may be that a limit for the subsequent movement of the actuator is determined by an increase in resistance. It may also be that a limit for the subsequent movement of the actuator is determined by a decrease in resistance.

A limit for the subsequent movement of the actuator may be determined by the rate of change in resistance, either over time or over distance moved by the actuator. Alternatively, a limit for the subsequent movement of the actuator may be determined by the resistance passing a predetermined limit.

Advantages of these embodiments are set out hereafter, and further details and features of each of these embodiments are defined in the accompanying dependent claims and elsewhere in the following detailed description.

BRIEF DESCRIPTION OF THE DRAWINGS

Various aspects of the teachings of the present invention, and arrangements embodying those teachings, will hereafter be described by way of illustrative example with reference to the accompanying drawings, in which.

DETAILED DESCRIPTION OF PREFERRED EMBODIMENTS

Preferred embodiments of the present invention will now be described with particular reference to a controller for use with a mechanical switch.

Figure 1:
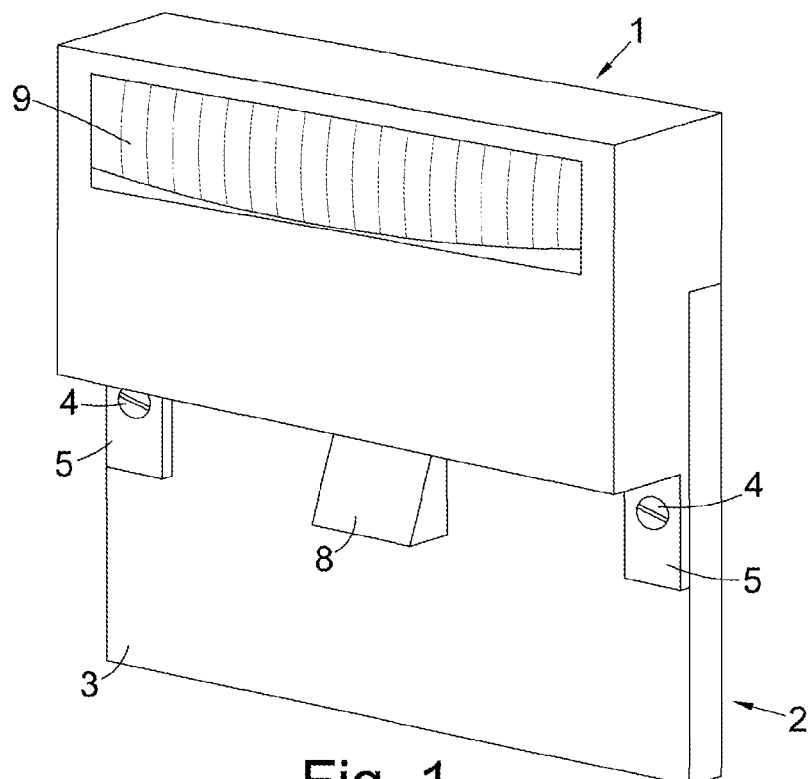
FIG. 1 is an illustration of an electrical controller according to the invention.

FIG. 1 shows an electrical controller 1 according to the invention, fitted to a wall mounted mechanical switch box 2. The switch box is of a type typically used to control lighting circuits, but switch boxes suitable for use with the electrical controller 1 can be used to control any electrical circuit.

The switch box 2 comprises a switch plate 3 and a backbox, and the switch plate 3 is attached to a backbox, in use, by the two fixing screws 4. The electrical controller 1 is provided with two flanges 5, which are in turn provided with holes suitable for accepting the two fixing screws 4. Therefore both the electrical controller 1 and the switch plate 3 can be secured to the back box using the two fixing screws 4, as shown in FIG. 1. The electrical controller 1 can be fitted to the switch box 2 at the time that the switch box 2 is installed, or it can be retrofitted at a later point.

The electrical controller 1 also comprises two adhesive strips (not visible) which are initially covered by removable patches. Removing the patches exposes the adhesive strips so that the electrical controller 1 can be adhered to a surface. The adhesive strips can be used instead of or in addition to screw mountings to fit the electrical controller 1 to a switch box 2.

Figure 2:
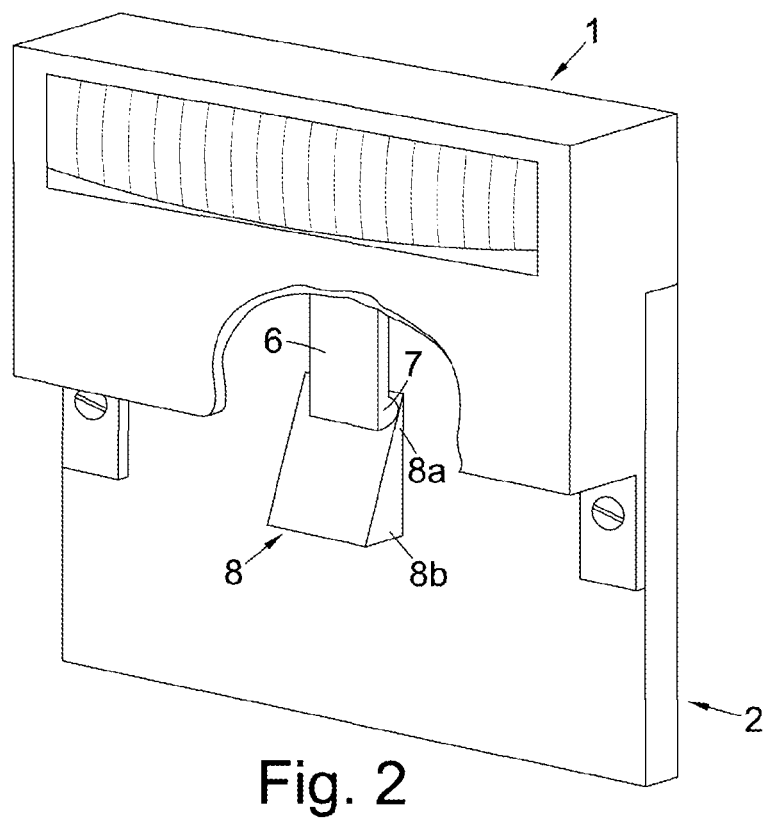
FIG. 2 is a cut-away illustration of the same electrical controller.

FIG. 2 shows the electrical controller 1 with a section cut away to show the actuator 6. The actuator 6 comprises a projection 7 which rests on the switch 8 of the switch box 2, in use, and can be driven by the electrical controller 1 to move with respect to the switch 8. The switch 8 comprises a first end 8a and a second end 8b.

Figure 3:
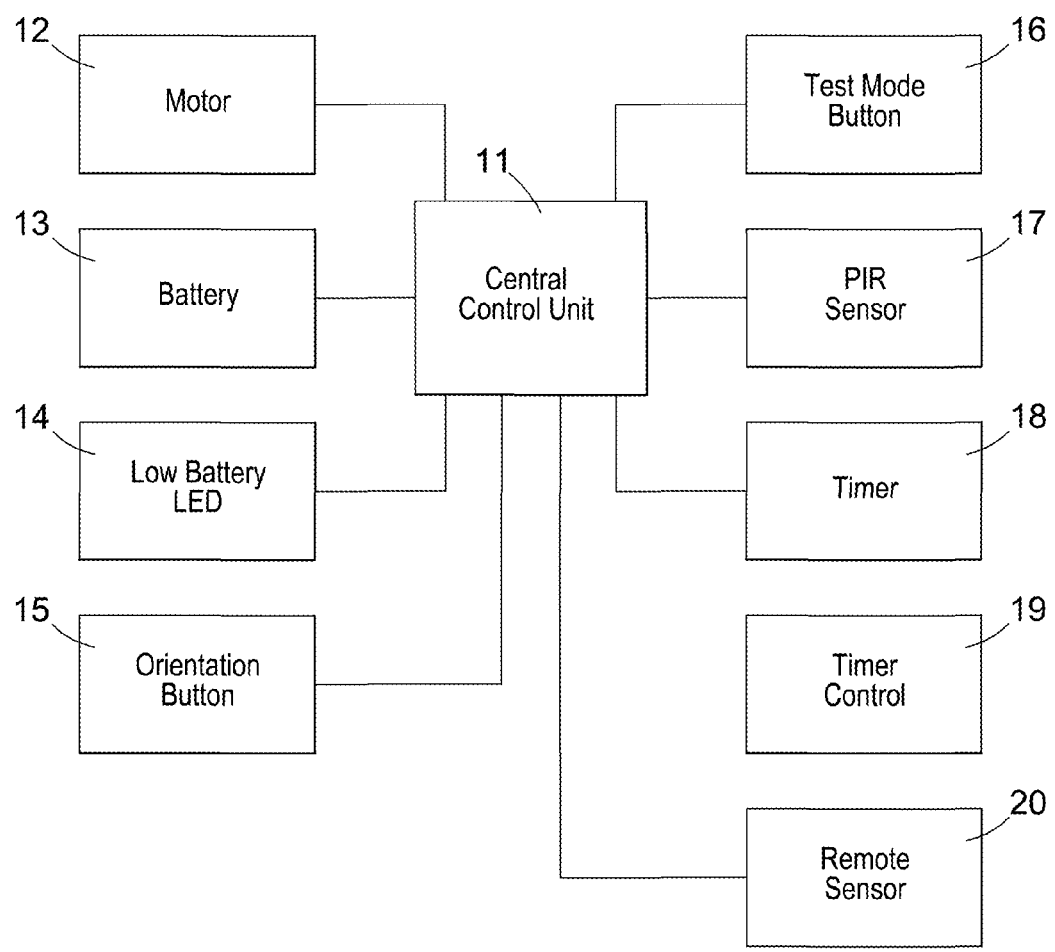
FIG. 3 is diagram of the components in the electrical controller.

FIG. 3 is a diagram of the electrical components of the electrical controller 1. The electrical controller comprises a central control unit 11 which transmits signals to and receives signals from the other components of the electrical controller 1. In particular, the central control unit 11 controls the motor 12 which operates the actuator 6 via a gear chain.

The electrical controller 1 comprises a battery 13, so that it can be powered without the need to provide an electrical connection to an external power source. The battery 13 may be a disposable battery, but rechargeable batteries are more typically used in order to reduce waste. Power from the battery 13 is used by the central control unit 11, the motor 12, and the other components of the electrical controller 1 shown in FIG. 3. The electrical controller 1 also comprises a low battery LED 14, which begins to flash when the available charge in the battery is low. This warns the user that they need to replace or recharge the battery 13.

In FIG. 2, the electrical controller 1 and switch box 2 are shown in a first position, in which the first end of the switch 8a is depressed. When the actuator 6 is operated, it extends out of the electrical controller 1 so that the projection 7 travels over the surface of the switch 8. This causes the second end of the switch 8b to depress, "switching" the switch and so moving both the actuator 6 and the switch box 2 into a second position. The projection 7 allows the actuator 6 to depress the second end of the switch 8b in the second position while still providing enough room for the first end of the switch 8a to rise beneath the actuator 6.

When the actuator 6 is further operated, it withdraws back into the electrical controller so that the projection 7 depresses the first end of the switch 8a, returning the actuator 6 and the switch box 2 to the first position. In this way the electrical controller 1 is able to operate the switch box 2 and so control an electrical circuit.

Typically, the first position is the "off" position, in which no current is allowed to flow in the circuit, and the second position is the "on" position, in which the circuit is completed. Therefore the central control unit 11 is programmed to equate the first position with the off position and the second position with the on position by default. However this is not always the case; for example limited space or aesthetic concerns may lead to the electrical controller 1 being installed beneath the switch box 2, or the switch box 2 may not follow the usual conventions for on/off control. Therefore the electrical controller 1 incorporates an orientation button 15, which the user can press during the fitting process. If the orientation button 15 is pressed, the central control unit 11 will equate the first position with the on position and the second position with the off position, until the orientation button 15 is pressed again. The orientation button 15 is in a recess on the rear of the electrical controller 2, so that it is protected by the switch plate 3 once the electrical controller 1 is installed, and therefore won't be accidentally pressed during everyday use.

Different switch boxes will often have different sizes of switch. For this reason the central control unit 11 is arranged to be able to monitor the load of the motor 12. When the switch 8 switches under pressure from the actuator 6, this creates a characteristic change in the load on the motor 13. Therefore the central control unit 11 can determine when a switch has been pressed, and disengage the motor 12. This protects the motor 12 and the gear train from overloading at the end of travel. Hence the electrical controller can be used with switch boxes with different sizes of switch, and adapt between them automatically.

In order to reduce power consumption, the central control unit 11 does not continuously monitor the load on the electrical motor. Instead, when the user fits the electrical controller 1 to a new switch box, they can put central control unit 11 into a test mode by pressing the test mode button 16. This causes the central control unit 11 to operate the actuator 6 and so determine the size of the switch on the switch box it is attached to. The central control unit 1 stores the distances the actuator 6 needed to move, and then moves the actuator 6 those same distances whenever it is subsequently operated. If the user wishes to move the electrical controller 1 to a new switch box, or if the actuator moves out of alignment with the switch, the user can put the central control unit 11 back into test mode in order to recalibrate it.

The electrical controller 1 also comprises a Passive Infra-Red (PIR) sensor 17, behind a lens 9 which can be seen in FIGS. 1 and 2. The PIR sensor 17 functions as person detector by detecting changes in heat in the space surrounding the electrical controller 1, such as those created by a passing human body.

The electrical controller 1 also comprises a timer 18 and a timer control 19.

In normal use, a person passing the electrical controller 1 will be detected by the PIR sensor 17. The PIR sensor 17 sends a signal to the central control unit 11, which checks whether the actuator 6 is in the off position. If the actuator is set to off, the central control unit 11 activates the motor 12 in order to operate the actuator 6 and so move the actuator 6 and the switch 8 to the on position. The central control unit 11 then sends a start signal to the timer 18. The timer 18 counts x seconds before sending a reply signal back to the controller. When the controller receives the reply signal, it activates the motor 12 in order to operate the actuator 6 and so move the actuator 6 and the switch 8 to the off position.

If the actuator is set to on when the central control unit 11 checks, the central control unit 11 does not activate the motor, but still sends a start signal to the timer 18, causing the timer to reset and begin counting x seconds again.

The timer control is a user operable control, accessible from the outside of the electrical controller 1. The number of seconds, x, counted by the timer in use is set by the timer control, which can be adjusted by the user to suit their needs.

Hence the electrical controller 1 and the switch box 2 together function as an automatic light control, which can detect a person, activate a light automatically, and then deactivate that light again after a predetermined amount of time has passed.

The electrical controller 1 also comprises a receiver 20, which is suitable for receiving signals from a remote control operated by the user. Using the remote control, the user can switch the electrical controller 1 between various modes. These include:

1. On Mode, where the switch remains in the on position.
2. Off Mode, where the switch remains in the off position.
3. Person Detection Mode, where the switch is activated for x seconds when a person is detected by the PIR sensor 17, as described above.
4. Timed On Mode, where the switch is set to the on position for x seconds and then set to the off position, whereupon the electrical controller 1 returns to Person Detection Mode.

The user can also use the remote control to: set the orientation of the electrical controller 1; put the electrical controller 1 into test mode; and change the number of seconds, x, counted by the timer.

In a further embodiment, an electrical controller 1 as described above also comprises an elastic member. The elastic member is attached to the actuator 6 such that the elastic member is loaded when the actuator 6 is operated so as to move into the on position. Once the switch 8 is in the on position, a latch engages the elastic member and the actuator 6 in order to prevent return movement. When the central control unit 11 determines that it is time to turn the lights off, the latch is released so that the elastic member can act upon the actuator 6, returning it to the off position and so returning the switch 8 to the off position also.

Figure 4:
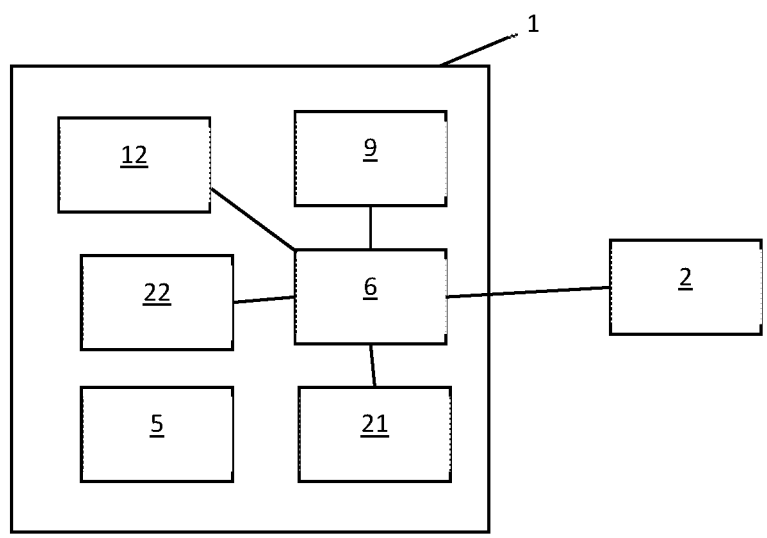
FIG. 4 is a diagram confirming the features of a controller in accordance with an example of the present disclosure.

FIG. 4 is a diagram confirming the features of a controller in accordance with an example of the present disclosure and showing a controller 1 for use with a mechanical switch 2. The controller 1 comprises at least one sensor 9, an actuator 6 and at least one attachment member 5 suitable for attaching the controller 1 to the mechanical switch 2 such that the actuator 6 is brought into contact with the mechanical switch 2. The actuator 6 is arranged to operate the mechanical switch 2 in response to a signal from the at least one sensor 9, in use. The actuator 6 is moved by an electrical motor 12. The controller 1 further comprises a detector 21 suitable for detecting resistance to the movement of the actuator 6. The controller further comprises a resilient member 22 attached to the actuator 6 such that moving the actuator 6 to operate the switch 2 places a load on the resilient member 22.

In summary, the present invention relate to a controller (1) for use with a mechanical switch (2). The controller (1) comprises at least one sensor (9), an actuator and at least one attachment member (5) suitable for attaching the controller (1) to the mechanical switch (2) such that the actuator is brought into contact with the mechanical switch (2). The actuator is arranged to operate the mechanical switch (2) in response to a signal from the at least one sensor (9), in use.

The invention claimed is:

1. A controller for use with a mechanical light switch, the controller comprising:
    at least one sensor;
    an actuator configured for engaging the mechanical light switch; and
    at least one attachment member suitable for attaching the controller to the mechanical switch such that the actuator is brought into contact with the mechanical switch, wherein the actuator is arranged to operate the mechanical switch in response to a signal from the at least one sensor, in use, and
    wherein the controller comprises a detector suitable for detecting resistance to the movement of the actuator so that the controller can determine when the mechanical light switch has been actuated and then cease operation of the actuator.

2. The controller as claimed in claim 1, wherein the sensor is a person detector.

3. The controller as claimed in claim 2, wherein the person detector is a Passive Infra-Red detector.

4. The controller as claimed in claim 1, wherein at least one sensor is a timer.

5. The controller as claimed in claim 1, wherein the actuator comprises an elongate arm.

6. The controller as claimed in claim 5, wherein the actuator comprises a protrusion which extends substantially orthogonally to the longitudinal axis of the elongate arm, and wherein the protrusion contacts the mechanical switch, in use.

7. The controller as claimed in claim 5, wherein the elongate arm moves longitudinally to operate the mechanical switch, in use.

8. The controller as claimed in claim 1, wherein the controller further comprises a battery.

9. The controller as claimed in claim 1, wherein the controller comprises a resilient member attached to the actuator such that moving the actuator to operate the switch places a load on the resilient member.

10. The controller as claimed in claim 1, wherein the actuator is moved by an electrical motor and the detector measures the load on the electrical motor, in use.

11. A method for calibrating the controller as claimed in claim 1, the method comprising:
    moving the actuator;
    detecting changes in resistance to the movement of the actuator; and
    setting limits for the subsequent movement of the actuator based upon the detected resistances.

12. The method as claimed in claim 11, wherein a limit for the subsequent movement of the actuator is determined by an increase in resistance.

13. The method as claimed in claim 11, wherein a limit for the subsequent movement of the actuator is determined by a decrease in resistance.

* * * * *